US012795847B2

(12) United States Patent
Walker et al.

(10) Patent No.: US 12,795,847 B2
(45) Date of Patent: Nov. 10, 2026

(54) MODULAR SYSTEM CHASSIS AND METHOD

(71) Applicant: ROCKWELL COLLINS, INC., Cedar Rapids, IA (US)

(72) Inventors: Anders P. Walker, Marion, IA (US); Aaron J. Smith, Marion, IA (US); Joshua M. Patocka, Cedar Rapids, IA (US); Joshua C. Beals, Cedar Rapids, IA (US); Brianne A. Riehl, Marion, IA (US); Bradley Schroeder, Glendale, AZ (US); Robert A. Newgard, Sun City West, AZ (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 155 days.

(21) Appl. No.: 18/808,211

(22) Filed: Aug. 19, 2024

(65) Prior Publication Data

US 2026/0052638 A1 Feb. 19, 2026

(51) Int. Cl.
*H05K 7/14* (2006.01)

(52) U.S. Cl.
CPC ......... *H05K 7/1435* (2013.01); *H05K 7/1427* (2013.01); *H05K 7/1454* (2013.01)

(58) Field of Classification Search
CPC ... H05K 7/1435; H05K 7/1427; H05K 7/1454
USPC .......................................................... 361/730
See application file for complete search history.

(56) References Cited

U.S. PATENT DOCUMENTS

| | | | | |
|---|---|---|---|---|
| 2011/0050052 | A1* | 3/2011 | Elkins | H05K 7/186 312/223.1 |
| 2013/0134270 | A1* | 5/2013 | Gagne | H02G 3/14 248/205.1 |
| 2013/0180774 | A1* | 7/2013 | Gagne | H02G 3/123 174/480 |
| 2021/0059080 | A1* | 2/2021 | Embleton | H05K 9/0041 |
| 2021/0351988 | A1 | 11/2021 | Gomez et al. | |

FOREIGN PATENT DOCUMENTS

| | | | |
|---|---|---|---|
| CN | 111692003 | A | 9/2020 |
| CN | 115963747 | A | 4/2023 |
| CN | 116381751 | A | 7/2023 |
| WO | 2023230719 | A1 | 12/2023 |

* cited by examiner

*Primary Examiner* — Hung S. Bui
(74) *Attorney, Agent, or Firm* — Millen, White, Zelano & Branigan P.C.; William F. Nixon

(57) ABSTRACT

A modular system chassis can be made from a variety of individual chassis modules. Each chassis module can be configured using a set of parts for providing between two and five slots for electronic modules conforming with an open system standard. Chassis modules can be stacked to provide a modular system chassis for rapid development of a chassis for demonstration and/or prototyping of electronic devices using electronic modules conforming with the open system standard.

18 Claims, 5 Drawing Sheets

MODULAR SYSTEM CHASSIS AND METHOD

FIELD OF THE INVENTION

The subject matter disclosed herein relates to chassis for electronic modules and, in particular, to a modular system chassis for modular open system electronic modules.

BACKGROUND OF THE INVENTION

A Modular Open Systems Approach (MOSA) is as a technical and logistical strategy for designing affordable and adaptable systems. Various MOSAs have been developed for electronic modules, such as by the Open Group Sensor Open System Architecture (SOSA™) Consortium, which developed the SOSA specification for sensors, and by the VMEbus International Trade Association (VITA), which developed the VPX (VITA 46), VNX (VITA 74), and VNX+ (VITA 90) specifications for various electronic modules, slots, and backplanes.

Typically, a chassis for holding a backplane and a plurality of modules will be designed or optimized for a particular application or end use. However, designing such a particular chassis for demonstration or prototyping purposes adds to the time and cost of development.

The above information disclosed in this Background section is only for understanding of the background of the inventive concepts and, therefore, it may contain information that does not constitute prior art.

SUMMARY OF THE INVENTION

The present disclosure provides a modular system chassis that uses a predetermined set of parts to make a plurality of chassis modules having support elements at a predetermined pitch to define multiple slots for one or more electronic modules conforming to an open system standard. Each chassis module also includes a card bracket configured to mount a modular backplane card for the electronic modules. Chassis modules having two-slots, three-slots, four-slots, or five-slots may be built with a set of fourteen parts, and multiple chassis modules may be stacked or otherwise connected to provide a chassis for demonstration or prototyping purposes.

The present disclosure is directed, in a first aspect, to a modular system chassis that has a chassis module. The chassis module has a rectangular front bracket, a rectangular rear bracket, extension bars extending therebetween, and a pair of rectangular side brackets. The rectangular front bracket has first side edges and a front periphery that defines a front opening. The rectangular card bracket has second side edges and a rear periphery that defines a rear opening. The extension bars fasten each corner of the rectangular front bracket and a corresponding corner of the rectangular card bracket. Each rectangular side bracket has a peripheral plate configured for attachment to a respective first side edge, second side edge, and pair of extension bars. At least one support element extends inward from the peripheral plate of each side bracket and includes a plurality of support extensions disposed at a predetermined pitch.

In an embodiment, the at least one support may include a first support extending inward from a first inward side of the peripheral plate and having a first plurality of support extensions disposed at the predetermined pitch, and a second support extending inward from a second inward side of the peripheral plate and having a second plurality of support extensions disposed at the predetermined pitch and at a same height as the first plurality of support extensions, and the front opening and the rear opening may be substantially rectangular and dimensioned to provide clearance for a predetermined number of electronic modules conforming to an open system standard.

In another embodiment, each extension bar may have a top surface, a bottom surface, and a side surface, wherein the top surface may have a plurality of first locating elements and the bottom surface may have a corresponding plurality of second locating elements configured to interface with the first locating elements.

In a further embodiment, the first locating elements may be lugs and the second locating elements may be recesses.

In yet another embodiment, each of the extension bars may have a first end surface and second end surface with a respective tapped hole for respective fastener attachment with the rectangular front bracket and rectangular card bracket, and the corners of the rectangular front bracket and the rectangular card bracket may have through holes for fastener attachment to respective extension bars.

In another embodiment, the side surface of each of the extension bar may have a plurality of tapped holes for fastener attachment with the peripheral plate of a respective rectangular side bracket.

In a further embodiment, the peripheral plate of each respective rectangular side bracket may have a plurality of through holes for fastener attachment to a respective extension bar.

In yet another embodiment, the rear periphery of the rectangular card bracket may be configured for attachment of a backplane card having a plurality of slots conforming to an open system standard.

In an embodiment, the modular system chassis may further include at least one additional chassis module stacked on the first chassis module via respective first and second locating elements.

In another embodiment, the extension bars may be dimensioned to substantially correspond to a length of an electronic module conforming with an open system standard, the front opening and the rear opening may be substantially rectangular and dimensioned to allow clearance for a plurality of the electronic modules, and the respective rectangular front bracket, rectangular card bracket, and rectangular side bracket of each chassis module may have a height dimension selected to accommodate a predetermined number of slots for the electronic module having two-slots, three-slots, four-slots, or five-slots at the predetermined pitch.

In a further embodiment, the predetermined pitch may be greater than a height of the electronic module conforming with the open system standard.

In yet another embodiment, the predetermined pitch may be 20 mm.

In an embodiment, the plurality of support extensions may be disposed to support the predetermined number of slots for the electronic module at the predetermined pitch.

In a further embodiment, a modular system chassis includes a first module chassis and a second module chassis. The first chassis module includes a first front bracket having a front periphery defining a first front opening, a first card bracket having a rear periphery defining a first rear opening, extension bars configured to extend between and fasten each corner of the first front bracket and a corresponding corner of the first card bracket, and a pair of first side brackets. Each first side bracket includes a first peripheral plate configured for attachment to the first front bracket, the first card bracket, and a pair of extension bars, and at least one first support extending inward from the first peripheral plate and having a plurality of first support extensions disposed at a predetermined pitch. The second chassis module includes a second front bracket having third side edges and a front periphery defining a second front opening, a second card bracket having fourth side edges and a rear periphery defining a second rear opening, extension bars configured to extend between and fasten each corner of the second front bracket and a corresponding corner of the second card bracket, and a pair of second side brackets. Each second side bracket includes a second peripheral plate configured for attachment to the second front bracket, the second card bracket, and a pair of extension bars, and at least one second support extending inward from the second peripheral plate and having a plurality of second support extensions disposed at the predetermined pitch. Each extension bar has a top surface and a bottom surface, wherein the top surface has a plurality of first locating elements and the bottom surface has a corresponding plurality of second locating elements configured to interface with the first locating elements. The first rear periphery of the first card bracket is configured for attachment of a first backplane card having between two and five slots conforming to an open system standard, and the second rear periphery of the second card bracket is configured for attachment of a second backplane card having between two and five slots conforming to the open system standard. The first and second chassis modules then are stacked by positioning first locating elements of one of the first or second chassis module to interface with the second locating elements of the other of the first or second chassis module.

In yet another embodiment, the present disclosure is directed to a modular method of building a chassis for electronic components. The method includes building a first chassis module by providing a rectangular front bracket having first side edges and a front periphery defining a front opening, providing a rectangular card bracket having second side edges and a rear periphery defining a rear opening, providing four extension bars, and providing a pair of rectangular side brackets. Each rectangular side bracket includes a peripheral plate and at least one support extending inward from the peripheral plate and having a plurality of support extensions disposed at a predetermined pitch. The method further includes fastening each of the four extension bars to a respective corner of the rectangular front bracket and a corresponding corner of the rectangular card bracket, and fastening the peripheral plates of the pair of rectangular side brackets to a respective first side edge, second side edge, and pair of extension bars.

In an embodiment, the step of providing four extension bars may include providing a plurality of locating lugs on a top surface of each extension bar and providing a corresponding plurality of locating recesses on a bottom surface of each extension bar.

In another embodiment, the method may further include building a second chassis module by repeating the steps of building the first chassis module, and stacking the first and second chassis modules by positioning locating lugs of one of the first or second chassis module into the positioning recesses of the other of the first or second chassis module.

In a further embodiment, the method may include dimensioning the provided extension bars to substantially correspond to a length of an electronic module conforming with an open system standard, dimensioning the front opening and the rear opening as substantially rectangular openings that provide clearance for a plurality of the electronic modules, and dimensioning a height of the respective rectangular front bracket, rectangular card bracket, and rectangular side bracket of each chassis module to accommodate a predetermined number of slots for the electronic module comprising two-slots, three-slots, four-slots, or five-slots at the predetermined pitch.

In further embodiments of the method, the predetermined pitch may be greater than a height of the electronic module conforming with the open system standard. For example, the predetermined pitch may be 20 mm.

BRIEF DESCRIPTION OF FIGURES

The features of the disclosure believed to be novel and the elements characteristic of the invention are set forth with particularity in the appended claims. The figures are for illustration purposes only and are not drawn to scale. The disclosure itself, however, both as to organization and method of operation, can best be understood by reference to the description of the preferred embodiment(s) which follows, taken in conjunction with the accompanying drawings in which:

DETAILED DESCRIPTION OF THE INVENTION

Figure 1:
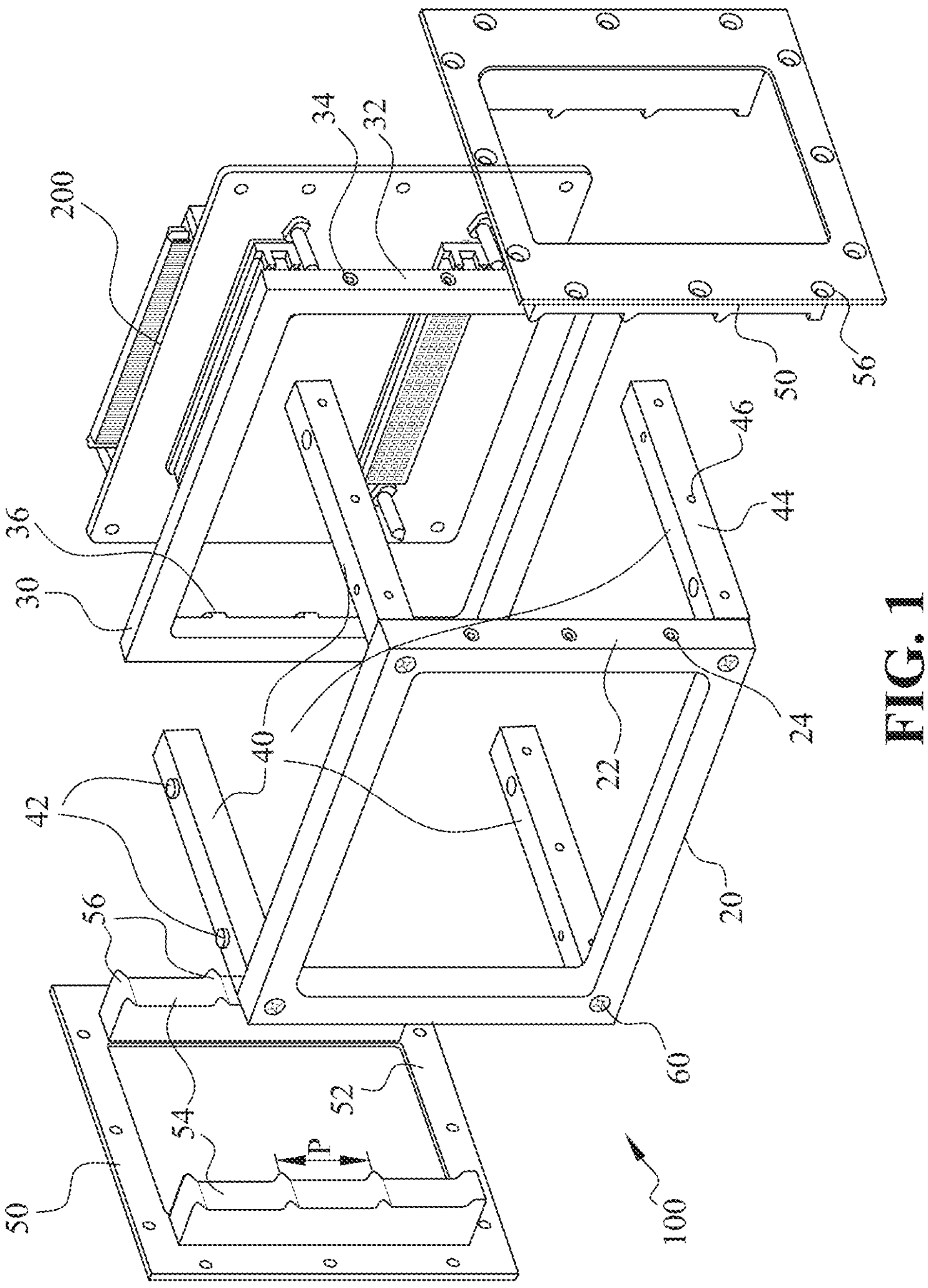
FIG. 1 is an exploded orthogonal view of a chassis module in accordance with the present disclosure and a corresponding backplane card.

The embodiments of the present disclosure can comprise, consist of, and consist essentially of the features and/or steps described herein, as well as any of the additional or optional components, steps, or limitations described herein or would otherwise be appreciated by one of skill in the art. It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein. Similarly, it may be understood that spatially relative terms such as "front," "top," "bottom," "side" and the like may be used herein for ease of description to describe the relations between one element or component and another element or component as illustrated in the drawings. It will be understood that the spatially relative terms are intended to encompass different orientations of the device in use or operation, in addition to the orientation depicted in the drawings.

The present disclosure is directed to a modular system chassis that can be made from a variety of individual chassis modules. Each chassis module can be configured using a set of parts for providing between two and five slots for electronic modules conforming with an open system standard. Chassis modules can be stacked to provide a modular system chassis for rapid development of a chassis for demonstration and/or prototyping of electronic devices using electronic modules conforming with the open system standard.

With reference to FIG. 1, a chassis module 100 can be used with other similar chassis modules 100, such as by stacking, as a building block of a modular system chassis that may be used for rapid development of an electronic device chassis for demonstration or prototyping purposes.

FIG. 1 is an exploded view of chassis module 100 and a modular backplane card 200. In at least one embodiment, omitting fasteners, eight discrete parts may form the chassis module 100, but typically only four of the parts will be unique. The discrete parts may include a rectangular front bracket 20, a rectangular card bracket 30, four extension bars 40, and two side brackets 50. In an embodiment with four unique parts, the four extension bars 40 are identical and the two side brackets 50 are identical, but the rectangular front bracket 20 and the rectangular card bracket 30 are unique.

In an alternate embodiment with three unique parts, the four extension bars 40 are identical, the two side brackets 50 are identical, and the rectangular front bracket 20 and the rectangular card bracket 30 are identical by using the rectangular card bracket 30 in place of the rectangular front bracket 20. While the use of three unique parts has logistical advantages, the rectangular card bracket 30 is additionally configured to mount a modular backplane card 200, such as with a plurality of mounting bosses 36. However, the extra material of the bosses 36 and the machining/fabrication involved (i.e., that is not needed for the rectangular front bracket 20) and the visibility of the card mounting structure on the front face may make the use of four unique parts the preferred option.

In a further alternate embodiment, the extension bars 40 may be formed integral with the side brackets 50, although such an option may increase the difficulty of assembly as well as the integration of thermal assemblies with the side brackets 50.

As illustrated in FIG. 1, the chassis module 100 includes a rectangular front bracket 20, a rectangular rear bracket 30, extension bars 40 extending therebetween, and a pair of rectangular side brackets 50.

The rectangular front bracket 20 includes first side edges 22 and a front periphery that defines a front opening. The rectangular card bracket 30 includes second side edges 32 and a rear periphery that defines a rear opening. In use, the front and rear openings permit an electronic module (not shown) to be inserted into the chassis module 100 through the front opening in rectangular front bracket 20 and pass through the rear opening in rectangular card bracket 30 in order to engage a connector on the backplane card 200.

The corners of the rectangular front bracket 20 and the rectangular card bracket 20 may include through holes such that fasteners 60 may be used to connect each respective corner of the rectangular front bracket 20 and the rectangular card bracket 20 to a respective extension bar 40. The through holes may be countersunk so that when machine screws are used as fasteners 60, an outer surface of the connection can remain flush.

The rear periphery of the rectangular card bracket 30 may be configured for attachment of a backplane card 200. Such a backplane card 200 may include a plurality of slots conforming to an open system standard, such as, but not limited to, SOSA, VPX (VITA 46), VNX (VITA 74), or VNX+ (VITA 90). FIG. 1 illustrates the rear periphery of the rectangular card bracket 30 as including a plurality of bosses 36 for mounting backplane card 200. Bosses 36 may include a tapped (i.e., threaded) hole for a machine screw fastener. The bosses 36 may provide a small amount of stand-off distance to prevent or minimize any physical interference between rectangular card bracket 30 and portions of the backplane card 200. Alternately, the bosses 36 may be replaced with tapped holes if potential physical interference is not an issue.

The extension bars 40 are configured to fasten each corner of the rectangular front bracket 20 and a corresponding corner of the rectangular card bracket 30. The extension bars 40 may be dimensioned such that an interior of the chassis module 100 has a length substantially corresponding to a length of a module or slot conforming to an open system standard. In the disclosed embodiments, the extension bars 40 have a substantially square cross section. In such a case, each extension bar 40 may have a top surface, a bottom surface, and a side surface that extend along the length dimension of the extension bar 40.

Figure 2:
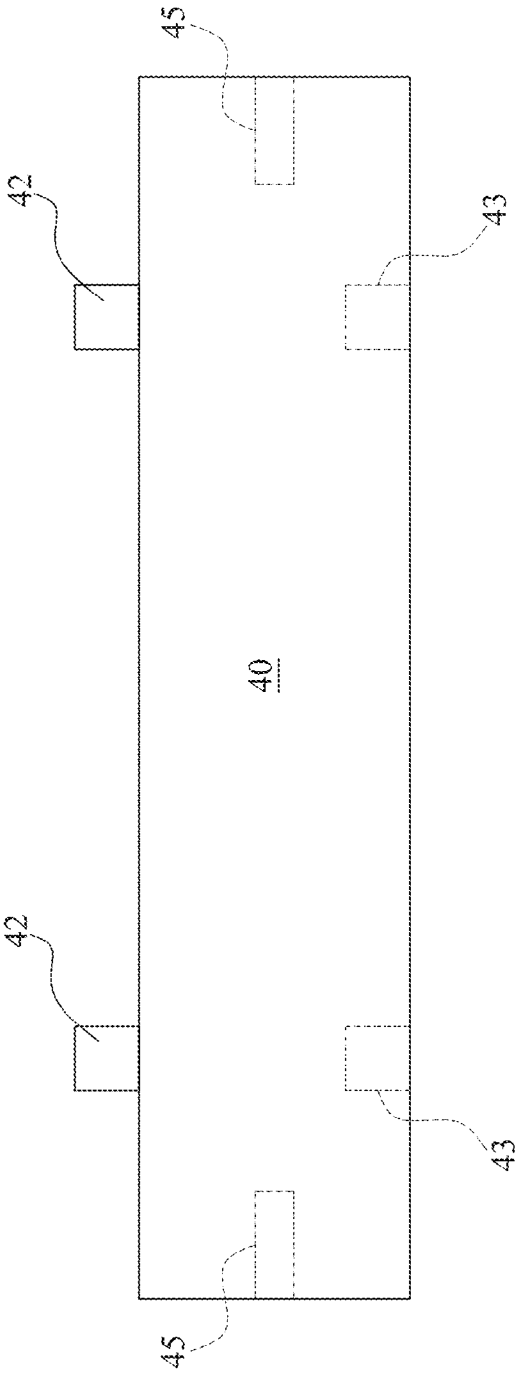
FIG. 2 is a detail view of a locating lug and locating recess of an extension bar in accordance with the present disclosure.

As illustrated in FIG. 1 and FIG. 2, in order to facilitate stacking of chassis modules 100, the top surface of each extension bar 40 may have a plurality of first locating elements 42 and the bottom surface may have a corresponding plurality of second locating elements 43 that are configured to interface with the first locating elements 42 with a press fit or the like. In the illustrated embodiments of FIG. 1 and FIG. 2A, cylindrical lugs are used as the first locating elements 42, and corresponding cylindrical recesses 43 are used as the second locating elements. However, the lugs and recesses are not limited to cylindrical shapes and any suitable shape may be used.

As further illustrated in FIG. 1, the side surface 44 of each extension bar 40 may have a plurality of tapped holes 46 for machine screw fasteners to be used for attachment of the peripheral plate 52 of a respective rectangular side bracket 50 to the extension bar 40.

Additionally, as illustrated in FIG. 2, each of the extension bars 40 may have a first end surface and second end surface with a respective tapped hole 45 for respective fastener attachment, such as via machine screw fastener 60 (see FIG. 1), with each of the rectangular front bracket 20 and rectangular card bracket 30.

Referring again to FIG. 1, each rectangular side bracket 50 includes a peripheral plate 52 at an outer periphery. The peripheral plate 52 may be configured for attachment to a respective first side edge 22, second side edge 32, and pair of extension bars 40. In the illustrated embodiment of FIG. 1, the peripheral plate 52 includes a plurality of countersunk through holes 56. Machine screw fasteners (see, e.g., FIG. 3B) may be inserted into through holes 56 to attach the peripheral plate 52 of the rectangular side bracket 50 via tapped holes 24, 34, and 46 of first side edge 22, second side edge 32, and extension bars 40, respectively.

Additionally, each rectangular side plate 50 includes at least one support element 54 that extends inward from the peripheral plate 52. The at least one support element 54 includes a plurality of support extensions 56 disposed at a predetermined pitch P. As illustrated in FIG. 1 and FIG. 3A, the shape/profile of the support extensions 56 and the predetermined pitch P may correspond to a slot 150 or electronic module conforming to an open system standard. The support extensions 56 may include surfaces having a radius to support a shape of such an electronic module.

Figure 3B:
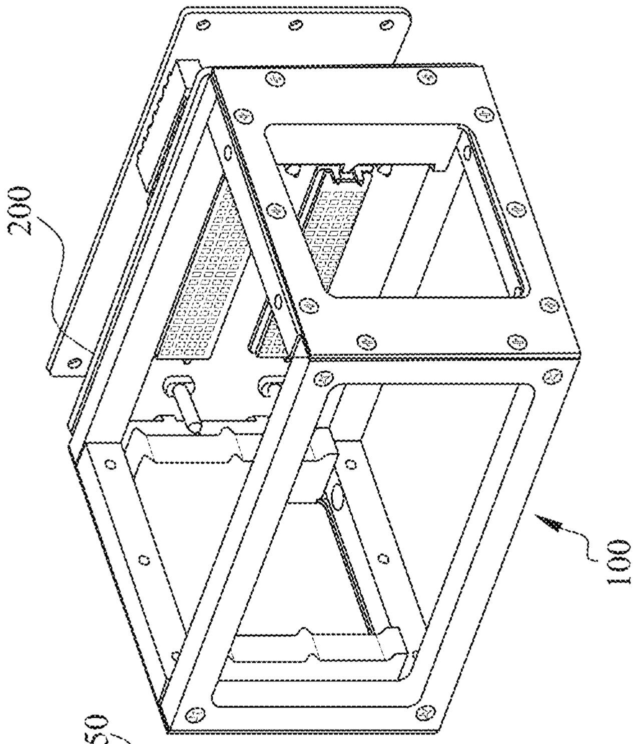
FIG. 3B is a front orthogonal view of a chassis module in accordance with the present disclosure and a corresponding backplane card.
Figure 3A:
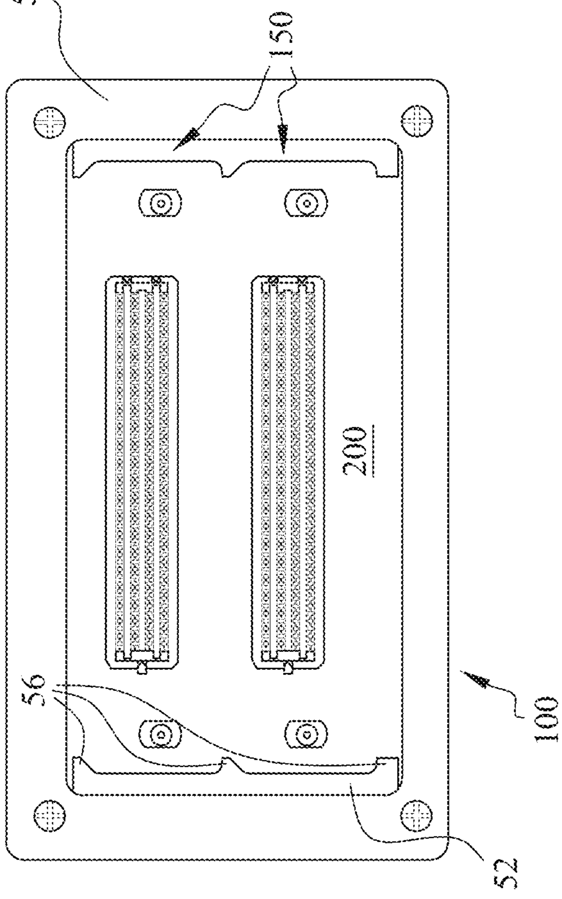
FIG. 3A is a front elevation view of a chassis module in accordance with the present disclosure and a corresponding backplane card.

In the illustrated embodiment of FIGS. 1, 3A, and 3B, the at least one support 54 may include a first support 54 extending inward from a first inward side of the peripheral plate 52 and having a first plurality of support extensions 56 disposed at the predetermined pitch P, and a second support 54 extending inward from a second inward side of the peripheral plate 52 and having a second plurality of support extensions 56 disposed at the predetermined pitch P. In this case, the second plurality of support extensions 56 are disposed at a same height as the first plurality of support extensions 56 to provide for a spaced support surface.

When the rectangular side bracket 50 includes a first support 54 extending inward from a first inward side of the peripheral plate 52 and a second support 54 extending inward from a second inward side of the peripheral plate 52, a space between the first and second support 54 may be open. Such an opening in the rectangular side brackets 50 may permit the flow of cooling fluid such as air over electronic modules installed in the chassis module 100, or may permit an external heat sink to pass through rectangular side bracket 50 to contact electronic modules installed in the chassis module 100. In an embodiment where the rectangular side bracket 50 is made of a material with high thermal conductivity, the first and second supports 54 may also act as heat sinks and may include cooling fins and the like (not shown) for additional heat transfer.

Referring to FIGS. 1 and 3A, the front opening and the rear opening of a chassis module 100 may be substantially rectangular and dimensioned to provide clearance for a predetermined number of slots or electronic modules conforming to an open system standard. In use, the plurality of support extensions 56 at the predetermined pitch P may be used to define a predetermined number of slots 150 conforming to the open system standard. Accordingly, a plurality of single slot electronic modules conforming to the open system standard may be secured within a chassis module 100. Alternately or additionally, with a known pitch P and a known geometry of the support extensions 56, a multi-slot electronic module may be secured within the chassis module 100.

FIG. 1 includes an exploded view of a chassis module 100 that includes three slots 150 conforming to the open system standard. FIG. 3B includes an assembled view of a chassis module 100 that includes two slots 150 conforming to the open system standard. Other chassis modules 100 may be made with more slots 150, for example having four slots 150 or five slots 150. In an embodiment where chassis modules 100 may include two, three, four, or five slots and each chassis module 100 uses four unique parts (i.e., rectangular front bracket 20, rectangular card bracket 30, extension bar 40, and rectangular side bracket 50), a set of parts having thirteen unique parts (i.e., 3 unique two-slot parts, 3 unique three-slot parts, 3 unique four-slot parts, 3 unique five-slot parts, and 1 unique extension bar part) can be used to build any of the various chassis modules 100.

The rectangular front brackets 20, rectangular card brackets 30, extension bars 40, and rectangular side brackets 50 used for the chassis modules 100 may be made of any suitable material, such as aluminum, composites, polymers, and combinations thereof and may have portions anodized, coated, or painted. For example, the parts could be entirely fabricated from aluminum, fabricated from aluminum and anodized, or fabricated substantially from aluminum that is then anodized, with polymer components such as friction fit nylon locating lugs 42 being added thereto.

Figure 4C:
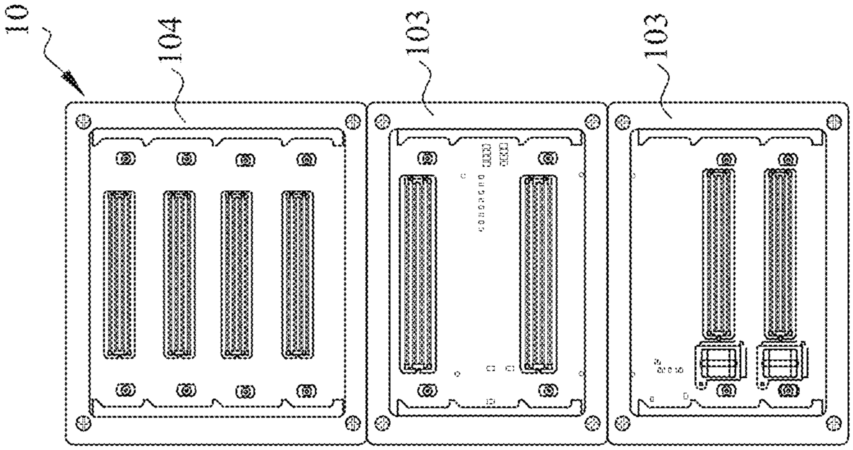
FIG. 4C is a front elevation view of an example modular system chassis having a four-slot chassis module stacked on a three-slot chassis module stacked on another three-slot chassis module in accordance with the present disclosure with corresponding backplane cards.
Figure 4B:
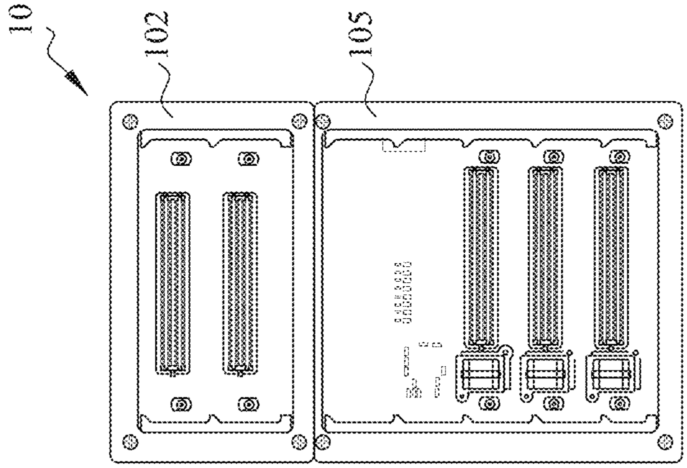
FIG. 4B is a front elevation view of an example modular system chassis having a two-slot chassis module stacked on a five-slot chassis module in accordance with the present disclosure with corresponding backplane cards.
Figure 4A:
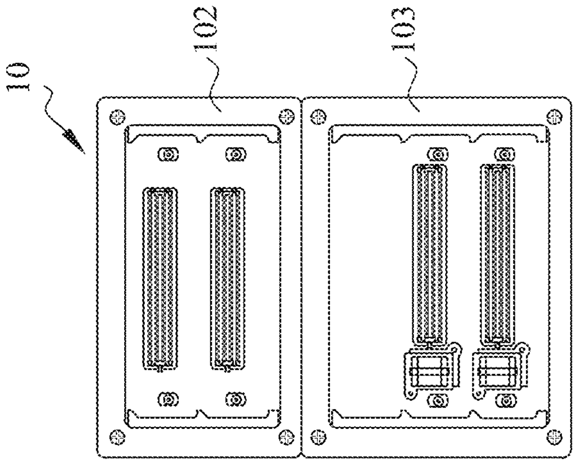
FIG. 4A is a front elevation view of an example modular system chassis having a two-slot chassis module stacked on a three-slot chassis module in accordance with the present disclosure with corresponding backplane cards.

Referring to FIGS. 4A, 4B, and 4C, in one or more embodiments, a modular system chassis 10 may include a first chassis module 100 and at least one additional chassis module 100 stacked on the first chassis module via respective first and second locating elements. In FIG. 4A, a two-slot chassis module 102 is stacked on a three-slot chassis module 103 to house Power and RF Aux modules, respectively. In FIG. 4B, a two-slot chassis module 102 is stacked on a five-slot chassis module 105 to house Power and Digital modules, respectively. In FIG. 4C, a four-slot chassis module 104 is stacked on a three-slot chassis module 103 that is stacked on a three-slot chassis module 103 to house Power Boost, Networking, and RF Aux modules, respectively. Accordingly, a flexible module chassis 10 can be made by stacking or otherwise connecting various chassis modules 102, 103, 104, and/or 105.

Referring to FIGS. 1-4C, in an embodiment, the extension bars 40 may be dimensioned to substantially correspond to a length of an electronic module conforming with an open system standard, the front opening and the rear opening may be substantially rectangular and dimensioned to allow clearance for a plurality of the electronic modules, and the respective rectangular front bracket 20, rectangular card bracket 30, and rectangular side bracket 50 of each chassis module 100, 102, 103, 104, 105 may have a height dimension selected to accommodate a predetermined number of slots 150 for the electronic module having two-slots, three-slots, four-slots, or five-slots at the predetermined pitch P.

In a further embodiment, the predetermined pitch P may be greater than a height of the electronic module conforming with the open system standard. For example, for the VITA 90 VNX+ open system standard with 19 mm high electronic modules, the predetermined pitch may be approximately 20 mm (i.e., 20.32 mm). In an embodiment, the plurality of support extensions 56 may be disposed to support the predetermined number of slots for the electronic module at the predetermined pitch P.

Figure 5:
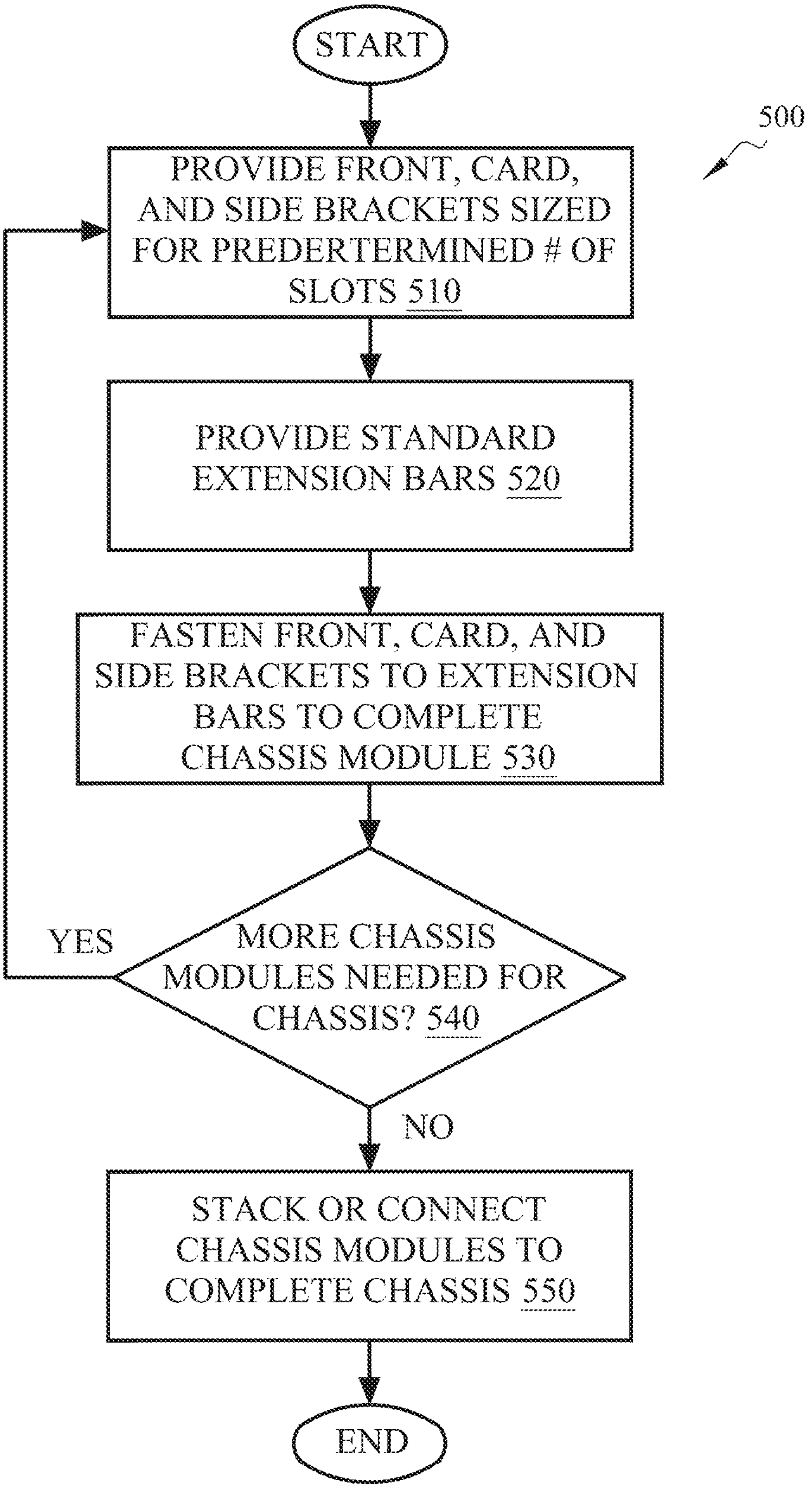
FIG. 5 is an example process flow for building a modular system chassis in accordance with the present disclosure.

Referring to the process flow of FIG. 5, in yet another embodiment, the present disclosure is directed to a modular method 500 of building a chassis for electronic components. The method 500 includes building a first chassis module. In a first step 510, front, card, and side brackets sized for a desired number of slots are provided. Specifically, unique parts for a chassis module 100 having a predetermined number of slots 150 are provided by selecting a rectangular front bracket 20 having first side edges and a front periphery defining a front opening, providing a rectangular card bracket 30 having second side edges and a rear periphery defining a rear opening, and providing a pair of rectangular side brackets 50, wherein the rectangular front bracket 20, the rectangular card bracket 30, and the pair of rectangular side brackets 50 are specific to providing a predetermined number of slots 150. Each rectangular side bracket 50 includes a peripheral plate 52 and at least one support 54 extending inward from the peripheral plate 52 and having a plurality of support extensions 56 disposed at a predetermined pitch P.

In a second step 520, standard extension bars 40 are provided. More specifically, the four extension bars 40 for a chassis module 100 are provided which are identical, regardless of the desired number of slots. Although disclosed in a particular order, the providing steps 510 and 520 may be performed in any order or simultaneously.

The method 500 further includes assembling the parts. In step 530, the front, card, and side brackets are fastened to the extension bars 40. In an embodiment, this includes fastening each of the four extension bars 40 to a respective corner of the rectangular front bracket 20 and a corresponding corner of the rectangular card bracket 30, and fastening the peripheral plates 52 of the pair of rectangular side brackets 50 to a respective first side edge 22, second side edge 32, and pair of extension bars 40. Although disclosed in a particular order, these parts may be assembled in any order.

In an embodiment, the step 520 of providing the extension bars may include providing a plurality of locating lugs 42 on a top surface of each extension bar and providing a corresponding plurality of locating recesses 43 on a bottom surface of each extension bar 40.

The method 500 may further include building a second chassis module 100 by repeating the steps of building the first chassis module 100. In an embodiment, a step 540 may determine whether more chassis modules 100 are needed for a modular system chassis 10. If the determination at step 540 is "YES", the method 500 moves to step 510 to begin building another chassis module 10. If the determination at step 540 is "NO", the method 500 moves to step 550, wherein a plurality of chassis modules 100 are stacked or otherwise connected to complete the modular system chassis 10. In an embodiment with two chassis modules, step 550 may include stacking first and second chassis modules 100 by positioning locating lugs 42 of one of the first or second chassis module into the positioning recesses 43 of the other of the first or second chassis module.

In a further embodiment, the method 500 may include dimensioning the provided extension bars 40 to substantially correspond to a length of an electronic module conforming with an open system standard, dimensioning the front opening and the rear opening as substantially rectangular openings that provide clearance for a plurality of the electronic modules, and dimensioning a height of the respective rectangular front bracket 20, rectangular card bracket 30, and rectangular side bracket 50 of each chassis module to accommodate a predetermined number of slots 150 for the electronic module that includes two-slots, three-slots, four-slots, or five-slots at the predetermined pitch P.

In further embodiments of the method 500, the predetermined pitch P may be greater than a height of the electronic module conforming with the open system standard. For example, the predetermined pitch may be approximately 20 mm (i.e., 20.32 mm) for the VITA 90 VNX+ open standard.

While the present disclosure has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present disclosure.

What is claimed is:

1. A modular system chassis, comprising:

a first chassis module including:

a rectangular front bracket having first side edges and a front periphery defining a front opening;

a rectangular card bracket having second side edges and a rear periphery defining a rear opening;

extension bars configured to extend between and fasten each corner of the rectangular front bracket and a corresponding corner of the rectangular card bracket; and a pair of rectangular side brackets, each rectangular side bracket having:

a peripheral plate configured for attachment to a respective first side edge, second side edge, and pair of extension bars;

at least one support extending inward from the peripheral plate and having a plurality of support extensions disposed at a predetermined pitch, wherein each extension bar has a top surface, a bottom surface, and a side surface, wherein the top surface has a plurality of first locating elements and the bottom surface has a corresponding plurality of second locating elements configured to interface with the first locating elements.

2. The modular system chassis of claim 1, wherein the at least one support includes a first support extending inward from a first inward side of the peripheral plate and having a first plurality of support extensions disposed at the predetermined pitch, and a second support extending inward from a second inward side of the peripheral plate and having a second plurality of support extensions disposed at the predetermined pitch and at a same height as the first plurality of support extensions, and wherein the front opening and the rear opening are substantially rectangular and dimensioned to provide clearance for a predetermined number of electronic modules conforming to an open system standard.

3. The modular system chassis of claim 2, wherein the rear periphery of the rectangular card bracket is configured for attachment of a backplane card having a plurality of slots conforming to the open system standard.

4. The modular system chassis of claim 1, wherein the first locating elements are lugs and the second locating elements are recesses.

5. The modular system chassis of claim 1, wherein each of the extension bars has a first end surface and second end surface with a respective tapped hole for respective fastener attachment with the rectangular front bracket and rectangular card bracket, and wherein the corners of the rectangular front bracket and the rectangular card bracket have through holes for fastener attachment to respective extension bars.

6. The modular system chassis of claim 5, wherein the side surface of each of the extension bar has a plurality of tapped holes for fastener attachment with the peripheral plate of a respective rectangular side bracket.

7. The modular system chassis of claim 6, wherein the peripheral plate of each respective rectangular side bracket has a plurality of through holes for fastener attachment to a respective extension bar.

8. The modular system chassis of claim 1, further comprising at least one additional chassis module stacked on the first chassis module via respective first and second locating elements.

9. The modular system chassis of claim 8, wherein the extension bars are dimensioned to substantially correspond to a length of an electronic module conforming with an open system standard;

wherein the front opening and the rear opening are substantially rectangular and dimensioned to allow clearance for a plurality of the electronic modules; and wherein the respective rectangular front bracket, rectangular card bracket, and rectangular side bracket of each chassis module has a height dimension selected to accommodate a predetermined number of slots for the electronic module comprising two-slots, three-slots, four-slots, or five-slots at the predetermined pitch.

10. The modular system chassis of claim 9, wherein the predetermined pitch is greater than a height of the electronic module conforming with the open system standard.

11. The modular system chassis of claim 10, wherein the predetermined pitch is approximately 20 mm.

12. The modular system of claim 9, wherein the plurality of support extensions is disposed to support the predetermined number of slots for the electronic module at the predetermined pitch.

13. A modular system chassis, comprising:

a first chassis module including:

a first front bracket having a front periphery defining a first front opening;

a first card bracket having a rear periphery defining a first rear opening;

extension bars configured to extend between and fasten each corner of the first front bracket and a corresponding corner of the first card bracket; and a pair of first side brackets, each first side bracket having:

a first peripheral plate configured for attachment to the first front bracket, the first card bracket, and a pair of extension bars;

at least one first support extending inward from the first peripheral plate and having a plurality of first support extensions disposed at a predetermined pitch;

a second chassis module including:

a second front bracket having third side edges and a front periphery defining a second front opening;

a second card bracket having fourth side edges and a rear periphery defining a second rear opening;

extension bars configured to extend between and fasten each corner of the second front bracket and a corresponding corner of the second card bracket; and a pair of second side brackets, each second side bracket having:

a second peripheral plate configured for attachment to the second front bracket, the second card bracket, and a pair of extension bars;

at least one second support extending inward from the second peripheral plate and having a plurality of second support extensions disposed at the predetermined pitch, wherein each extension bar has a top surface and a bottom surface, wherein the top surface has a plurality of first locating elements and the bottom surface has a corresponding plurality of second locating elements configured to interface with the first locating elements, wherein the first rear periphery of the first card bracket is configured for attachment of a first backplane card having between two and five slots conforming to an open system standard, wherein the second rear periphery of the second card bracket is configured for attachment of a second backplane card having between two and five slots conforming to the open system standard, and wherein the first and second chassis modules are stacked by positioning first locating elements of one of the first or second chassis module to interface with the second locating elements of the other of the first or second chassis module.

14. A modular method of building a chassis for electronic components, comprising building a first chassis module by:

providing a rectangular front bracket having first side edges and a front periphery defining a front opening;

providing a rectangular card bracket having second side edges and a rear periphery defining a rear opening;

providing four extension bars by providing a plurality of locating lugs on a top surface of each extension bar and providing a corresponding plurality of locating recesses on a bottom surface of each extension bar; and providing a pair of rectangular side brackets, each rectangular side bracket having:

a peripheral plate; and at least one support extending inward from the peripheral plate and having a plurality of support extensions disposed at a predetermined pitch;

fastening each of the four extension bars to a respective corner of the rectangular front bracket and a corresponding corner of the rectangular card bracket;

fastening the peripheral plates of the pair of rectangular side brackets to a respective first side edge, second side edge, and pair of extension bars.

15. The method of claim 14, further comprising:

building a second chassis module by repeating the steps of building the first chassis module; and stacking the first and second chassis modules by positioning locating lugs of one of the first or second chassis module into the positioning recesses of the other of the first or second chassis module.

16. The method of claim 15, further comprising:

dimensioning the provided extension bars to substantially correspond to a length of an electronic module conforming with an open system standard;

dimensioning the front opening and the rear opening as substantially rectangular openings that provide clearance for a plurality of the electronic modules; and dimensioning a height of the respective rectangular front bracket, rectangular card bracket, and rectangular side bracket of each chassis module to accommodate a predetermined number of slots for the electronic module comprising two-slots, three-slots, four-slots, or five-slots at the predetermined pitch.

17. The method of claim 16, wherein the predetermined pitch is greater than a height of the electronic module conforming with the open system standard.

18. The method of claim 17, wherein the predetermined pitch is approximately 20 mm.

* * * * *